United States Patent

Tsubokura et al.

Patent Number: 6,090,306
Date of Patent: Jul. 18, 2000

[54] PIEZOELECTRIC CERAMICS

[75] Inventors: Taeko Tsubokura; Hitoshi Oka; Kazuo Miyabe; Masayoshi Inoue, all of Nihonbashi, Japan

[73] Assignee: TDK Corporation, Tokyo, Japan

[21] Appl. No.: 09/248,314

[22] Filed: Feb. 11, 1999

[30] Foreign Application Priority Data

Feb. 12, 1998 [JP] Japan ................... 10-046283
Mar. 30, 1998 [JP] Japan ................... 10-102171

[51] Int. Cl.[7] .............. H01L 41/00; C04B 35/475; C04B 35/472; C04B 35/499
[52] U.S. Cl. ................ 252/62.9 R; 501/134; 501/135; 501/136
[58] Field of Search ............. 252/62.9 R; 501/134, 501/135, 136

[56] References Cited

U.S. PATENT DOCUMENTS 4,601,841  7/1986  Yasuda et al. ............. 252/62.9 R

FOREIGN PATENT DOCUMENTS 63-151667  6/1988  Japan.
3-60463    3/1991  Japan.
7-206517   8/1995  Japan.

*Primary Examiner*—C. Melissa Koslow
*Attorney, Agent, or Firm*—Oblon, Spivak, McClelland, Maier & Neustadt, P.C.

[57] ABSTRACT

Provided is a piezoelectric ceramic which achieves a high density, good temperature characteristics and a high Curie temperature, which can fully prevent (a) a decrease in Qmax (Qmax refers to a tan$\theta$max when the maximum value of phase angles of third harmonic is a $\theta$max), (b) a decrease in q (dynamic range of resonance frequency), (c) an increase in a fundamental wave and (d) the occurrence of a spurious mode in the vicinity of third harmonic, caused by downsizing, and which can materialize a small-sized high-performance piezoelectric element, the piezoelectric ceramic having a composition of the general formula,

$$(Pb_{a-k-y-z}Sr_xLn_yBi_z)(Ti_{1-b-c}Mn_bMe_c)O_3$$

wherein Ln is at least one element selected from the group consisting of La, Ce and Pr, Me is at least one element selected from the group consisting of Nb, Sb and Ta, and x, y, z, a, b and c represent molar ratios, the composition satisfying $0 \leq x \leq 0.2$, $0 < y \leq 0.1$, $0.001 \leq z \leq 0.1$, $0.93 \leq a \leq 1$, $0.005 \leq b \leq 0.05$ and $0.005 \leq c \leq 0.05$.

3 Claims, 2 Drawing Sheets

PIEZOELECTRIC CERAMICS

BACKGROUND OF THE INVENTION

1. Field of the Invention

The present invention relates to piezoelectric ceramics formed of lead titanate ($PbTiO_3$) as a main component, and more specifically, it relates to piezoelectric ceramics utilizing third harmonic of thickness extensional vibration.

2. Description of the Prior Art

In recent years, piezoelectric elements are widely used in ceramic resonators, ceramic filters, piezoelectric displacement elements, piezoelectric buzzers and piezoelectric transducers, etc. The area of use thereof is widening, while the characteristics required of them are also diversified and increasingly severe. Particularly, electronic parts are recently increasingly required to meet the demands of downsizing and higher performances, and materials used for the electronic parts are also finding very severe standards of downsizing and higher performances.

For a piezoelectric ceramic, there are used materials containing $PbTiO_3$ as a main component or materials containing $Pb(Ti,Zr)O_3$ as a main component (PZT materials), or there are used materials which are improved in piezoelectric characteristics and electric characteristics by incorporating a variety of additives as second and third components into the above materials.

Of the above materials, the PZT materials excellent in piezoelectric characteristics and temperature characteristics have been being particularly energetically developed. As the above PZT materials, there are known materials which are improved in various physical properties by using zircon-lead titanate as a main component and adding oxides of metals such as Mn, Cr, Co, Fe, etc., thereto or by forming a solid solution of a composite oxide represented by $Pb(Mg_{1/3}Nb_{2/3})O_3$.

On the other hand, a lead-titanate-containing material containing both an oxide of rare earth metal and an oxide of other metal has been proposed for a piezoelectric element for high frequencies. The above material has a low dielectric constant and excellent piezoelectric characteristics as compared with the PZT materials. However, the above material has a defect in a difficulty in forming a ceramic having a large size due to the poor sinterability thereof and has severe polarization conditions so that the yield of ceramics therefrom is low in mass production.

In the application of a piezoelectric ceramic to an electronic part, an electronic part for high frequencies in particular, attempts are being made to utilize third harmonic of thickness extensional vibration to attain the downsizing and higher performances. In a conventional oscillator element utilizing thickness extensional vibration, however, the downsizing (a decrease in an area where electrodes are formed) causes a decrease in Qmax, causes a decrease in the dynamic range of oscillation or causes a spuriousness in the vicinity of third harmonic, so that it is difficult to materialize a downsized and higher-performance piezoelectric element. In the present specification, Qmax refers to a tanθmax when the maximum value of phase angles in third harmonic is a θmax.

For overcoming the above problems, for example, JP-A-63-151667 discloses a piezoelectric ceramic composition prepared by incorporating at least one element selected from Sr, Ca or Ba and La and Mn into a $PbTiO_3$-containing material. The above publication describes that the occurrence of a spuriousness in the vicinity of vibration at third harmonic and the variability of P/V (impedance ratio of resonance and antiresonance) of vibration at third harmonic are inhibited.

JP-A-3-60463 discloses a piezoelectric ceramic formed of a dense material which is a $(Pb,La)TiO_3$-containing material and has a theoretical density ratio of at least 96%. The above Publication also says that the occurrence of a spuriousness in the vicinity of vibration at third harmonic and the variability of P/V of three-fold wave vibration are inhibited.

Further, JP-A-7-206517 discloses a piezoelectric ceramic composition obtained by adding Cu, Zr and Mn to a $(Pb,La)TiO_3$-containing material. The above publication describes that the addition of Zr, etc., can serve not only to decrease the size of a crystal grain but also to control the size of a crystal grain depending upon frequencies in use, so that the dynamic range of resonance can be increased and that the shift from resonance at third harmonic to resonance at fifth harmonic takes place in no case.

However, Examples of the above Publications use elements having a diameter of 15 to 18 mm for the evaluation of piezoelectric ceramic compositions for characteristics. When elements have a size to the above degree, it cannot be said that they are downsized. For example, a ceramic oscillator element for driving a hard disc is required to operate at a frequency of above 40 MHz with having square dimensions of 4 mm or less. When piezoelectric ceramics disclosed in the above Publications are downsized to such a degree, there is caused a problem that the above Qmax and q decrease or that a spuriousness takes place in the vicinity of third harmonic.

SUMMARY OF THE INVENTION

It is an object of the present invention to provide a piezoelectric ceramic which can materialize a high density, good temperature characteristics and a high Curie temperature, which permits the sufficient prevention of a decrease in Qmax, a decrease in q, an increase in fundamental wave and the occurrence of the spurious modes in the vicinity of third harmonic and which can materialize a small-sized and high-performance piezoelectric element.

The above object is achieved by any one of the following constitutions (1) to (3).

(1) A piezoelectric ceramic having a composition of the general formula, $$(Pb_{a-x-y-z}Sr_xLn_yBi_z)(Ti_{1-b-c}Mn_bMe_c)O_3$$

wherein Ln is at least one element selected from the group consisting of La, Ce and Pr, Me is at least one element selected from the group consisting of Nb, Sb and Ta, and x, y, z, a, b and c represent molar ratios, the composition satisfying $0 \leq x \leq 0.2$, $0 < y \leq 0.1$, $0.001 \leq z \leq 0.1$, $0.93 \leq a \leq 1$,
$0.005 \leq b \leq 5\ 0.05$, and
$0.005 \leq c \leq 0.05$.

(2) The piezoelectric ceramic as recited in the above (1), which has a Curie temperature of at least 290° C.

(3) The piezoelectric ceramic as recited in the above (1) or (2), which permits an electrode-forming surface of 16 mm² or less when utilized as a piezoelectric element.

BRIEF DESCRIPTION OF DRAWINGS

FIGS. 1A and 1B are graphs showing frequency-phase angle curves and frequency-impedance curves of piezoelectric ceramics, FIG. 1A shows a case where spurious mode is non-existent, and FIG. 1B shows a case where spurious mode is exhibited.

DETAILED DESCRIPTION OF THE INVENTION

The piezoelectric ceramic of the present invention is preferably used as an oscillator element, etc., since the temperature coefficient of its resonance frequency is within ±20 ppm/° C. in the temperature range of from −40 to 85° C. so that the variation of oscillation frequency with a change in temperature is small. In the present specification, the temperature coefficient of the resonance frequency in the temperature range of −40 to 85° C. refers to an average of temperature coefficients at −40° C., −20° C., 60° C. and 85° C. When the resonance frequency at a temperature T is taken as fT, the temperature coefficient of the resonance frequency at the temperature T is represented by $(fT-f25)/[f25(T-25)]$.

Further, since the piezoelectric ceramic of the present invention has a Curie temperature of as high as at least 290° C., its characteristics cannot be deteriorated by heat during a solder reflow. Further, it causes no spuriousness in the vicinity of third harmonic when downsized. Moreover, since the decrease in Qmax and the decrease in a dynamic range (q) caused by downsizing are small, a downsized and high-performance piezoelectric element can be materialized. Furthermore, since the dependency of q on dimensions is small, it is not required to modify the ceramic in composition, which is remarkably industrially advantageous.

The piezoelectric ceramic of the present invention has a composition of the following general formula.

$(Pb_{a-x-y-z}Sr_xLn_yBi_z)(Ti_{1-b-c}Mn_bMe_c)O_3$

In the above general formula, Ln is at least one element selected from the group consisting of La, Ce and Pr, Me is at least one element selected from the group consisting of Nb, Sb and Ta, and x, y, z, a, b and c represent molar ratios.

The composition satisfies
$0 \leq x \leq 0.2$,
$0 < y \leq 0.1$,
$0.001 \leq z \leq 0.1$,
$0.93 \leq a \leq 1$,
$0.005 \leq b \leq 5\ 0.05$, and
$0.005 \leq c \leq 0.05$.
Preferably,
$0.05 \leq x \leq 0.15$, and
$0.02 \leq y \leq 0.08$.

When the quantity of x for the ratio of Sr is too large, the temperature coefficient of resonance frequency increases on negative side, and the oscillation frequency in a practical temperature range varies to a great extent, so that it is difficult to apply the ceramic as an oscillator element, and the like. The temperature coefficient of resonance frequency in the temperature range of from −40 to 85° C. is preferably within ±20 ppm/° C. When it is greater than the above range, it is difficult to apply the ceramic to an oscillator element, and the like. When the quantity of x is too large, the Curie temperature is low, and the ceramic characteristics are degraded during a solder reflow, so that the ceramic is no longer feasible as a piezoelectric ceramic. Further, when the quantity of x is too large, the dynamic range (q) decreases when the element is downsized, and the piezoelectric characteristics are impaired. Moreover, the occurrence of a spuriousness in the vicinity of third harmonic is observed, Qmax decreases, and an oscillation at other frequency takes place. x may be Q, while, if $x \leq 0.05$, the temperature coefficient of resonance frequency is small, and q when the element is downsized can be increased.

When the quantity of y for the ratio of Ln is too small, the ceramic is poor in sinterability and poor in strength. Further, when the quantity of y is too small, the specific resistance decreases, so that the ceramic undergoes no easy polarization. When the quantity of y is too large, the Curie temperature decreases and the characteristics of the ceramic are degraded to a great extent during a solder reflow, so that the ceramic is no longer feasible as a piezoelectric ceramic. Further, when the quantity of y is too large, the temperature coefficient of resonance frequency increases on positive side, and the ceramic is no longer applicable to an oscillator element. Whether the quantity of y is too small or too large, Qmax 1st is large, and the first vibration cannot be inhibited at a designing time, so that the oscillation frequency tends to shift from third harmonic to a fundamental wave. The above Qmax 1st refers to tanθmax 1st when the maximum value of a phase angle of a fundamental wave is θmax 1st.

The effect produced by the addition of Ln is equal among the three elements of La, Ce and Pr, so the content ratios of these elements in Ln are therefore not specially limited.

When the quantity of z for the ratio of Bi is too small, q is small and it comes to be small particularly when the element is downsized. Further, the ceramic is poor in sinterability, so that the piezoelectric characteristics are poor and the element is liable to undergo large deformation. When the quantity of z is too large, a secondary phase is precipitated at a grain boundary, so that the piezoelectric characteristics are impaired.

Lead titanate is a perovskite type compound of $ABO_3$ type, and the molar ratio A/B (Pb/Ti) thereof in the stoichiometric composition is 1. The piezoelectric ceramic of the present invention is a ceramic in which the above elements are substituted in the A site and B site of lead titanate, so that the above "a" corresponding to the molar ratio A/B is generally 1. However, the above "a" varies to some extent in some cases depending upon the amount of a Pb-supplying component in raw materials and sintering conditions. However, so long as "a" is in the range of $0.93 \leq a \leq 1$, the object of the present invention is fully achieved. When "a" is less than 0.93, the piezoelectric characteristics are deteriorated. When "a" exceeds 1, not only the sinterability is poor, but also the electric resistance decreases so that the ceramic cannot undergo polarization, and the ceramic is no longer feasible as a piezoelectric ceramic.

In the present invention, Ti is required to be partly replaced with Mn and Me. When at least one of "b" for the ratio of replacement of Ti by Mn and "c" for the ratio of replacement of Ti by Me is 0, no polarization can take place, and the ceramic can no longer be used as a piezoelectric ceramic. Further, even when none of "b" and "c" is 0 but when at least one of "b" and "c" is less than 0.005, undesirably, an electrical breakdown is liable to take place during polarization. When at least one of "b" and "c" exceeds 0.05, not only the sinterability is poor, but also the electric resistance decreases so that the ceramic cannot undergo polarization, and the ceramic can be no longer used as a piezoelectric ceramic.

The effect by the addition of Me is produced by any one of the three elements of Nb, Ta and Sb, and the ratios of contents of these elements in Me are therefore not specially limited. However, if at least part of Me, preferably at least 20 mol % of Me, is occupied by Ta and/or Sb, a decrease in q caused by the downsizing can be more favorably prevented.

In the above general formula, the molar ratio of oxygen (O) to the B site element is shown as 3, while the stoichiometric composition of the piezoelectric ceramic of the present invention changes depending upon ratios of the elements which replace Pb and Ti, and also changes depending upon valences of the elements which perform the above replacements. For example, Mn is generally considered to be present as a trivalent element, while it can be converted to a divalent or tetravalent element depending upon various conditions such as a sintering atmosphere. Further, Bi is generally considered to be present as a trivalent element, while it can have a pentavalence. In the present specification, the molar ratio of the oxygen is shown as 3 without relying upon the replacement ratio and the valence of each element, while the actual molar ratio of the oxygen is not required to be 3, and the molar ratio of the oxygen may be outside the stoichiometric composition.

The piezoelectric ceramic of the present invention may contain a trace amount of Ca, Ba, etc., as impurities. When the content of the impurities such as Ca, Ba, etc., is expressed in terms of a ratio of replacement of Sr, the ratio of replacement of Sr by the impurities is preferably 2 mol % or less. When the content of the impurities such as Ca, Ba, etc., is too large, the effect of the present invention may be impaired in some cases.

The piezoelectric ceramic of the present invention has a perovskite structure of $(Pb,Sr,Ln,Bi)(Ti,Mn,Me)O_3$, while it may be an incomplete solid solution. Further, the piezoelectric ceramic of the present invention may be a ceramic which is not completely homogeneous, for example, which contains a different phase, so long as the composition thereof as a whole is within the above compositional range. That is, the piezoelectric ceramic of the present invention is a solid solution of a perovskite type compound, $PbTiO_3$, of which elements are replaced in some places. It is considered that Sr, Ln and Bi are present in the Pb site and that Mn and Me are present in the Ti site, while the presence of these elements in the above sites is not essential. For example, parts of these elements may be present in grain boundary phases and may form different phases.

Although not specially limited, the average grain size of the piezoelectric ceramic of the present invention is preferably 0.5 to 2.0 $\mu$m, more preferably 1.0 to 1.5 $\mu$m.

In the piezoelectric ceramic of the present invention, the temperature coefficient of the resonance frequency in the temperature range of −40 to 85° C. can be brought into a range within ±20 ppm/° C., and can be also brought into a range within ±10 ppm/° C., so that the variation of the resonance frequency caused by a change in temperature decreases, and that the piezoelectric ceramic of the present invention is preferably used as an oscillator element.

In the piezoelectric ceramic of the present invention, further, a Curie temperature of at least 290° C. can be attained, and a Curie temperature of at least 330° C. can be also attained, so that the piezoelectric ceramic of the present invention is free from an extraordinary deterioration of characteristics during a solder reflow and that the deterioration of characteristics can be avoided during the formation of an element.

Further, in the piezoelectric ceramic of the present invention, a decrease in q is small when the element is downsized. For example, when a small-sized element of which the electrode-forming-surface has plan dimensions of 2.7 mm×0.85 mm (an area of 2.30 mm$^2$) has a dynamic range of qs1 and when a large-sized element of which the electrode-forming-surface has plan dimensions of 7.0 mm×7.5 mm (an area of 52.5 mm$^2$) has a dynamic range of qL, the use of the piezoelectric ceramic of the present invention can attain a qs1/qL of 80 to 100%, and can also attain a qs1/qL of 90 to 100%. Since the piezoelectric ceramic of the present invention exhibits a low dependency of q on dimensions, it is not required to modify the composition depending upon the size of the element, which is remarkably industrially advantageous.

The piezoelectric ceramic of the present invention is suitable for a ceramic resonator, a ceramic filter, a piezoelectric buzzer, a microphone, and the like. Since the characteristics of the piezoelectric ceramic of the present invention are not much deteriorated when the area of the electrode-forming surface of the piezoelectric ceramic is decreased to 16 mm$^2$ or less, particularly to 12 mm$^2$ or less, further to 3 mm$^2$ or less, for adapting it to the above devices, small-sized high-performance piezoelectric devices can be materialized.

One example of the method of producing the piezoelectric ceramic of the present invention will be explained below.

As starting materials, first, oxides or compounds which are convertible to oxides by firing, e.g., carbonates, hydroxides, oxalates, nitrates, etc., specifically, PbO, $TiO_2$, $Bi_2O_3$, $SrCO_3$, $La_2O_3$, $CeO_2$, $Pr_6O_{11}$, $MnO_2$, $Nb_2O_5$, $Ta_2O_5$, $Sb_2O_3$, etc., are used. Powders of these are weighed such that the final composition is the above-described composition, and the powders are wet-mixed with a ball mill or the like. The starting materials preferably have an average particle diameter of approximately 1.0 to 5.0 μm. In the wet-mixing, a slurry preferably has a solid concentration of approximately 30 to 50% by weight. A medium for the slurry is preferably selected from water, alcohols such as ethanol or a mixture of water with an alcohol.

The starting materials are fully mixed, the mixture is calcined at a temperature of approximately 800 to 1,000° C. for approximately 1 to 3 hours, the obtained calcined product is slurried, and the resultant slurry is wet-milled with a ball mill, and the like. In this case, the slurry preferably has a solid concentration of approximately 30 to 50% by weight. A medium for the slurry is preferably selected from water, alcohols such as ethanol or a mixture of water with an alcohol. The wet-milling is preferably carried out until the calcined product has an average particle diameter of approximately 0.5 to 2.0 μm.

After the wet-milling, a powder of the calcined product is dried, a small amount (approximately 4 to 8% by weight) of water is added to the dry product, the mixture is press-shaped at a pressure of 1 to 4 tons/cm² to obtain a shaped material. In this case, a binder such as polyvinyl alcohol, etc., may be added. For the shaping, an extrusion method or other shaping method can be used.

Then, the shaped material is fired to obtain a piezoelectric ceramic. The firing temperature can be set preferably in the range of from 1,250 to 1,350° C., and the firing is carried out preferably for approximately 3 to 5 hours. The firing may be carried out in atmosphere, or it may be carried out in an ambient atmosphere having a higher oxygen partial pressure than that in atmosphere or in an ambient atmosphere of pure oxygen.

EXAMPLES

In the following Examples, raw materials were selected from $PbO$, $TiO_2$, $Bi_2O_3$, $SrCO_3$, $La_2O_3$, $CeO_2$, $Pr_6O_{11}$, $Nd_2O_3$, $Sm_2O_3$, $Tb_2O_3$, $Dy_2O_3$, $MnO_2$, $Nb_2O_5$, $Ta_2O_5$, and $Sb_2O_3$. These raw materials were powders having an average particle diameter of 1 to 5 μm.

Example 1

Powders of starting materials were compounded so as to form a final composition shown in Table 1, and these starting materials were wet-mixed with a ball mill. In the wet-mixing, a slurry was adjusted to a solid concentration of 40% by weight, and water was used as a medium for the slurry.

Then, the mixture was calcined at 900° C. for 2 hours, and the resultant calcined product was wet-milled with a ball mill until it had an average particle diameter of 1.5 μm. In the wet-milling, a slurry was adjusted to a solid concentration of 40% by weight, and water was used as a medium for the slurry. The slurry was dried, and then 6% by weight of water was added to the dry product in the form of a powder. The mixture was press-shaped at a pressure of 2.5 tons/cm² to obtain a shaped article having a length of 20 mm, a width of 20 mm and a height of 15 mm.

The shaped article was fired at a temperature shown in Table 1 in atmosphere to obtain a piezoelectric ceramic sample.

The above piezoelectric ceramic sample was measured for a density according to an Archimedean method. Table 2 shows the result.

Further, the piezoelectric ceramic sample was processed into a size of 6.2 mm in length×3.9 mm in width×0.4 to 0.5 mm in thickness, Ag electrodes were formed on two main surfaces thereof, and the sample was measured for a Curie temperature (Tc). Table 2 shows the result.

Then, the piezoelectric ceramic sample was processed to a 0.4 to 0.5 mm thick sample, an Ag paste was applied to the two main surfaces thereof, and the sample was treated for polarization by applying an electric field of 6 kV/mm in a silicone oil at 120° C. for 20 minutes.

Then, the sample was diced so as to have an electrode-forming surface having plan dimensions of 7.0 mm×7.5 mm (an area of 52.5 mm²) or 2.7 mm×0.85 mm (an area of 2.30 mm²), and Cu electrodes were bonded thereto, to obtain a sample for measuring characteristics.

The sample for measuring characteristics was measured for resonance frequencies at −40 to 85° C. with an impedance analyzer, to determine a temperature coefficient of the resonance frequencies in the above temperature range. Table 2 shows the result as a temperature characteristic.

Further, the sample for measuring characteristics was measured for a Qmax and a dynamic range (q) in a third harmonic mode of thickness extensional vibration with using a standard circuit of I.R.E. As described already, Qmax is a tanθmax (θ is a maximum value of phase angle θz) in the third harmonic mode, and with an increase in Qmax, the oscillation is more stabilized. Further, q=20·log(Za/RO) (in which Za is an antiresonance impedance and RO is a resonance impedance). When the area was 52.5 mm², Qmax is expressed as QL and the dynamic range is expressed as qL, and When the area was 2.30 mm², Qmax is expressed as Qs1 and the dynamic range is expressed as qs1. Table 2 shows the results. Further, Table 2 also shows qs1/qL.

Further, the sample for measuring characteristics was evaluated for the occurrence of a spuriousness by observing a waveform. Table 2 shows the result. The evaluations shown in Table 2 are as follows.

◯: No occurrence of a spuriousness

X: A spuriousness occurred.

Figure 1A:
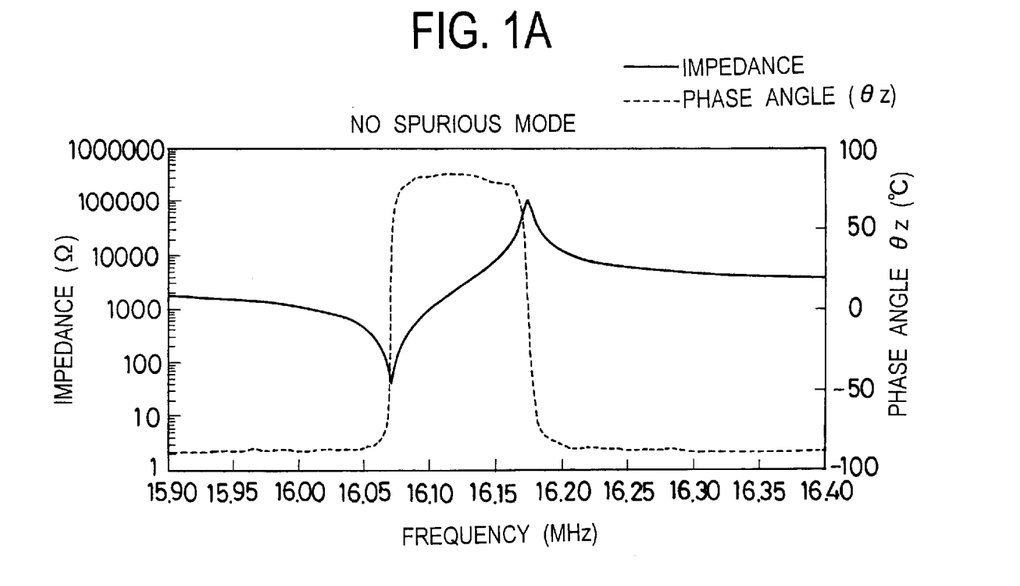
Figure 1B:
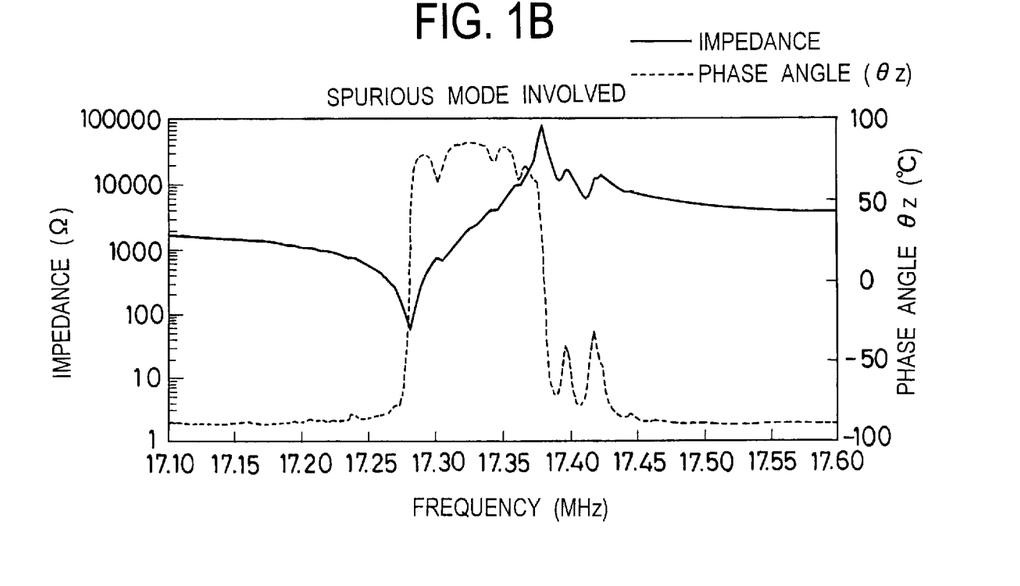

As examples of the waveform, FIG. 1(a) shows a waveform when no spuriousness takes place, and FIG. 1(b) shows a waveform when a spuriousness takes place. The waveform in FIG. 1(a) is the waveform of sample No. 106 (example of the present invention), and the waveform in FIG. 1(b) is the waveform of sample No. 108 (comparative sample). The spuriousness was evaluated with regard to samples having an area of 2.30 mm².

TABLE 1

| Sample | Composition | | | | | | Firing temperature |
|---|---|---|---|---|---|---|---|
| No. | x (Sr) | y (Ln) | z (Bi) | a (A/B) | b (Mn) | c (Me) | (° C.) |
| 101 | — | 0.09 (La) | 0.02 | 0.96 | 0.02 | 0.03 (Nb) | 1320 |
| 102 | — | 0.08 (La) | 0.02 | 0.96 | 0.02 | 0.03 (Nb) | 1320 |
| 103 | — | 0.06 (La) | 0.02 | 0.96 | 0.02 | 0.03 (Nb) | 1290 |
| 104 | 0.05 | 0.04 (La) | 0.02 | 0.96 | 0.02 | 0.03 (Nb) | 1290 |
| 105 | 0.10 | 0.04 (La) | 0.02 | 0.96 | 0.02 | 0.03 (Nb) | 1265 |
| 106 | 0.15 | 0.02 (La) | 0.02 | 0.96 | 0.02 | 0.03 (Nb) | 1265 |
| 107** | 0.20 | —* | 0.02 | 0.96 | 0.02 | 0.03 (Nb) | 1265 |
| 108** | 0.25* | —* | 0.02 | 0.96 | 0.02 | 0.03 (Nb) | 1290 |

*) Outside the scope of the present invention
**) Comparison

TABLE 2

(continued from Table 1)

| Sample | Density | Tc | Temperature Characteristics | Qmax | | q | | | Spurious |
|---|---|---|---|---|---|---|---|---|---|
| No. | (g/cm$^3$) | (° C.) | (ppm/° C.) | $Q_L$ | $Q_{S1}$ | $q_L$ | $q_{S1}$ | $q_{S1}/q_L$ (%) | mode |
| 101 | 7.60 | 320 | 17.63 | 24.31 | 18.27 | 74.11 | 62.98 | 84.98 | ○ |
| 102 | 7.64 | 338 | 16.92 | 18.77 | 10.33 | 69.49 | 64.57 | 92.92 | ○ |
| 103 | 7.75 | 373 | 8.76 | 16.43 | 14.58 | 69.95 | 63.74 | 91.51 | ○ |
| 104 | 7.67 | 374 | 2.50 | 16.93 | 11.07 | 70.20 | 66.46 | 94.67 | ○ |
| 105 | 7.54 | 341 | −1.89 | 19.80 | 16.54 | 72.71 | 65.83 | 90.54 | ○ |
| 106 | 7.43 | 339 | −9.61 | 20.87 | 16.57 | 72.37 | 65.85 | 90.99 | ○ |
| 107** | 7.32 | 338 | −17.67 | 23.15 | 14.37 | 72.70 | 61.45 | 84.53 | X |
| 108** | 7.17 | 303 | −22.67* | 23.39 | 16.73 | 72.95 | 62.53 | 85.72 | X |

*) Outside preferred range
**) Comparison

Each sample shown in Table 2 had a density of at least 95% based on the theoretical density thereof. This data shows that each sample was fully densified. Further, the samples of the present invention have a Tc of at least 290° C., and it is therefore seen that the deterioration of characteristics during the solder reflow can be prevented. Further, concerning the samples of the present invention, the temperature characteristic of their resonance frequencies are within ±20 ppm/° C., and it is therefore seen that an oscillator element having a small variation in oscillation frequency in a practical temperature range can be obtained. Further, when the plan dimensions of the electrode-forming area are decreased, the samples of the present invention can give sufficiently large Qmax and q, and qs1/qL is at least 84% and as large as close to 95% when it is the largest. It is therefore seen that a decrease in q caused by the downsizing of the element is small. Further, the samples of the present invention show no spuriousness in the vicinity of third harmonic.

In contrast, the occurrence of a spuriousness in the vicinity of third harmonic was observed in the comparative samples (Nos. 107 and 108) when they were downsized. It is also seen that the change in the ratio of q caused by downsizing in these comparative samples is large since their qs1/qL is small as compared with the samples of the present invention whose Ln contents are within the preferred range.

It is considered that the results of the comparative samples are caused by the addition of no Ln. In the comparative sample No. 108, further, the Sr amount is too large, and the temperature coefficient comes to be large on the minus side.

Figure 2:
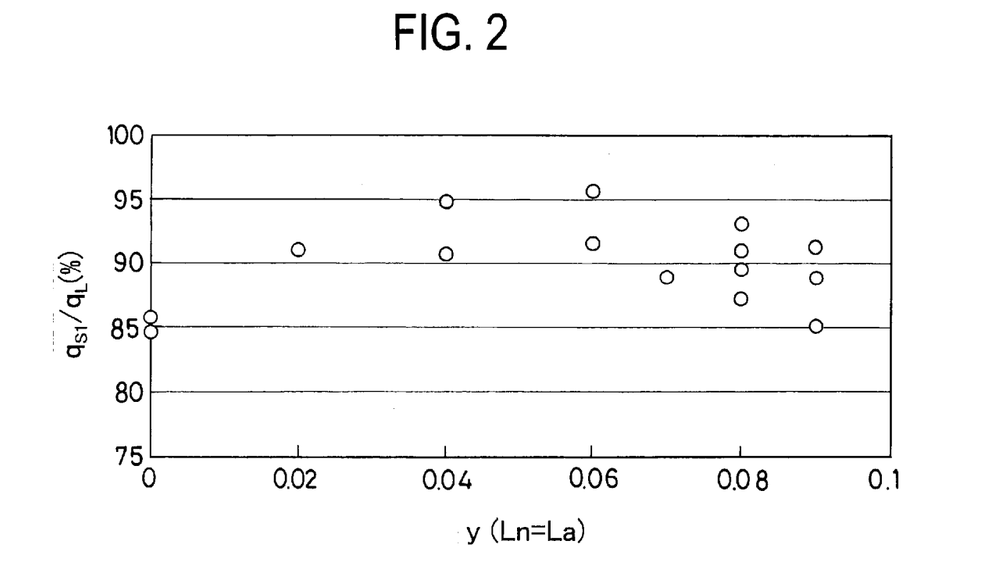
FIG. 2 is a graph showing a relationship between y showing an Ln content and a ratio of q of a small-area element to q of a large-area element (qs1/qL).

FIG. 2 shows the relationship between the ratio of the replacement by La (y in Table 1) and qs1/qL. FIG. 2 shows that when y is in the range of from 0.02 to 0.06, qs1/qL is particularly large, as large as at least 90%. The data shown in FIG. 2 came from the samples in Examples 1 and 2.

Example 2

Piezoelectric ceramic samples and samples for measuring characteristics were prepared in the same manner as in Example 1 except that starting materials were compounded so as to obtain final compositions shown in Table 3 and that the firing temperature was changed as shown in Table 3. Each sample was measured for a density, a Tc, a temperature characteristic of resonance frequencies, a qL and a qs1, a qs1/qL was determined, and the samples were studied for the occurrence of a spuriousness. Table 4 shows the results.

TABLE 3

| Sample No. | Composition | | | | | | Firing temperature (° C.) |
|---|---|---|---|---|---|---|---|
| | x (Sr) | y (Ln) | z (Bi) | a (A/B) | b (Mn) | c (Me) | |
| 201 | — | 0.09 (La) | 0.02 | 0.98 | 0.02 | 0.03 (Nb) | 1320 |
| 202 | — | 0.08 (La) | 0.02 | 0.98 | 0.02 | 0.03 (Nb) | 1320 |
| 203 | — | 0.06 (La) | 0.02 | 0.98 | 0.02 | 0.03 (Nb) | 1265 |
| 204 | 0.05 | 0.04 (La) | 0.02 | 0.98 | 0.02 | 0.03 (Nb) | 1320 |
| 205 | 0.10 | 0.04 (La) | 0.02 | 0.98 | 0.02 | 0.03 (Nb) | 1290 |
| 206 | 0.07 | 0.07 (La) | 0.02 | 1.00 | 0.02 | 0.03 (Nb) | 1320 |
| 207 | 0.03 | 0.08 (La) | 0.02 | 1.00 | 0.02 | 0.03 (Nb) | 1320 |
| 208 | 0.05 | 0.08 (La) | 0.02 | 1.00 | 0.02 | 0.03 (Nb) | 1320 |
| 209 | — | 0.09 (La) | 0.02 | 1.00 | 0.02 | 0.03 (Nb) | 1320 |

TABLE 4

(continued from Table 3)

| Sample No. | Density (g/cm$^3$) | Tc (° C.) | Temperature Characteristics (ppm/° C.) | q | | | Spurious mode |
|---|---|---|---|---|---|---|---|
| | | | | $q_L$ | $q_{s1}$ | $q_{s1}/q_L$ (%) | |
| 201 | 7.64 | 320 | 16.11 | 66.38 | 58.85 | 88.66 | ○ |
| 202 | 7.68 | 338 | 15.72 | 65.76 | 59.75 | 90.86 | ○ |
| 203 | 7.79 | 373 | 5.12 | 57.33 | 54.76 | 95.52 | ○ |
| 204 | 7.70 | 374 | −0.13 | 54.61 | 51.76 | 94.78 | ○ |
| 205 | 7.56 | 341 | −5.12 | 62.10 | 56.33 | 90.71 | ○ |
| 206 | 7.45 | 311 | 2.40 | 65.60 | 58.20 | 88.72 | ○ |
| 207 | 7.51 | 312 | 9.41 | 65.90 | 57.40 | 87.10 | ○ |
| 208 | 7.49 | 302 | 4.47 | 66.10 | 59.10 | 89.41 | ○ |
| 209 | 7.50 | 319 | 13.09 | 66.90 | 61.00 | 91.18 | ○ |

The samples shown in Table 4 gave the results equivalent to those of the samples of the present invention shown in Table 2 with regard to the density, the Tc, the temperature coefficient of resonance frequency, the q and the spuriousness, and the qs1/qL was far larger, as large as at least 95% at the largest.

Example 3

Piezoelectric ceramic samples and samples for measuring characteristics were prepared in the same manner as in Example 1 except that starting materials were compounded so as to obtain final compositions shown in Table 5 and that the firing temperature was changed as shown in Table 5. In Table 5, samples Nos. 301 to 304 are comparative samples using Nd, Sm, Tb or Dy in place of Ln specified in the present invention. Each sample was measured for a density, a Tc, a temperature coefficient of resonance frequency, a qL and a qs1, and a qs1/qL was determined. Table 6 shows the results.

TABLE 5

| Sample No. | Composition x (Sr) | y (Ln) | z (Bi) | a (A/B) | b (Mn) | c (Me) | Firing temperature (° C.) |
|---|---|---|---|---|---|---|---|
| 301** | — | 0.09 (Nd)* | 0.02 | 1.00 | 0.02 | 0.03 (Nb) | 1345 |
| 302** | — | 0.09 (Sm)* | 0.02 | 1.00 | 0.02 | 0.03 (Nb) | 1289 |
| 303** | — | 0.09 (Tb)* | 0.02 | 1.00 | 0.02 | 0.03 (Nb) | 1320 |
| 304** | — | 0.09 (Dy)* | 0.02 | 1.00 | 0.02 | 0.03 (Nb) | 1320 |
| 305 | — | 0.09 (Pr) | 0.02 | 0.96 | 0.02 | 0.03 (Nb) | 1320 |
| 306 | 0.05 | 0.04 (Pr) | 0.02 | 0.96 | 0.02 | 0.03 (Nb) | 1320 |
| 307 | 0.15 | 0.02 (Pr) | 0.02 | 0.96 | 0.02 | 0.03 (Nb) | 1295 |
| 308 | 0.10 | 0.04 (Pr) | 0.02 | 0.96 | 0.02 | 0.03 (Nb) | 1295 |
| 309 | 0.15 | 0.02 (La:Pr = 75:25) | 0.02 | 0.96 | 0.02 | 0.03 (Nb) | 1320 |
| 310 | 0.15 | 0.02 (La:Pr = 50:50) | 0.02 | 0.96 | 0.02 | 0.03 (Nb) | 1320 |
| 311 | 0.15 | 0.02 (La:Pr = 25:75) | 0.02 | 0.96 | 0.02 | 0.03 (Nb) | 1320 |
| 312 | 0.15 | 0.02 (La:Ce = 75:25) | 0.02 | 0.96 | 0.02 | 0.03 (Nb) | 1320 |
| 313 | 0.15 | 0.02 (La:Ce = 50:50) | 0.02 | 0.96 | 0.02 | 0.03 (Nb) | 1320 |
| 314 | 0.15 | 0.02 (La:Ce = 25:75) | 0.02 | 0.96 | 0.02 | 0.03 (Nb) | 1320 |

*) Outside the scope of the present invention
**) Comparison

TABLE 6

(continued from Table 5)

| Sample No. | Density (g/cm³) | Tc (° C.) | Temperature Characteristics (ppm/° C.) | Qmax | | q | | | Remarks |
|---|---|---|---|---|---|---|---|---|---|
| | | | | $Q_L$ | $Q_{S1}$ | $q_L$ | $q_{S1}$ | $q_{S1}/q_L$ (%) | |
| 301** | 7.62 | 344 | 56.35* | 9.06 | 8.00 | 56.13 | 61.06 | 108.78 | |
| 302** | 7.72 | 390 | 29.80* | 3.14 | 1.98 | 34.37 | 41.30 | 120.16 | |
| 303** | — | — | — | — | — | — | — | — | NP |
| 304** | — | — | — | — | — | — | — | — | NP |
| 305 | 7.66 | 320 | 15.16 | 21.97 | 14.00 | 73.80 | 64.11 | 86.87 | |
| 306 | 7.66 | 374 | −0.94 | 22.14 | 15.09 | 73.66 | 65.60 | 89.06 | |
| 307 | 7.54 | 341 | 14.00 | 20.31 | 14.42 | 72.36 | 61.73 | 85.31 | |
| 308 | 7.43 | 331 | −4.56 | 19.14 | 13.45 | 71.54 | 61.00 | 85.27 | |
| 309 | 7.43 | 338 | −5.66 | 21.65 | 14.74 | 72.95 | 65.36 | 89.60 | |
| 310 | 7.44 | 339 | −3.95 | 21.49 | 14.83 | 73.95 | 63.00 | 85.19 | |
| 311 | 7.44 | 340 | −4.35 | 21.84 | 15.57 | 73.85 | 63.95 | 86.59 | |
| 312 | 7.45 | 337 | −5.94 | 22.66 | 18.74 | 73.46 | 63.10 | 85.90 | |
| 313 | 7.43 | 337 | −5.65 | 22.59 | 14.13 | 73.76 | 67.84 | 91.97 | |
| 314 | 7.43 | 337 | −3.81 | 23.02 | 15.00 | 74.54 | 64.00 | 85.86 | |

*) Outside preferred range
**) Comparison
NP) Not processible

Table 6 shows that even the use of Pr or Ce as Ln gives results equivalent to those of the samples of the present invention in Example 1. In contrast, the comparative sample No. 301 using Nd shows poor temperature characteristics, and cannot be used for as an oscillator element. Further, the comparative sample No. 302 using Sm has too low an electric resistance for a polarization, so that no sufficient characteristics can be obtained. Further, the comparative samples (Nos. 303 and 304) using Tb or Dy were broken to pieces when their fired products were processed.

Example 4

Piezoelectric ceramic samples and samples for measuring characteristics were prepared in the same manner as in Example 1 except that starting materials were compounded so as to obtain final compositions shown in Table 7. Each sample was measured for a density, a Tc, a temperature coefficient of resonance frequency, a QL, a Qs2, a qL and a qs2, and a qs2/qL was determined. The Qs2 and qs2 are Qmax and q when each electrode-forming surface has plan dimensions of 2.4 mm×0.85 mm (an area of 2.04 mm²). Table 8 shows the results.

TABLE 7

| Sample No. | x (Sr) | y (Ln) | z (Bi) | a (A/B) | b (Mn) | c (Me) | Firing temperature (° C.) |
|---|---|---|---|---|---|---|---|
| 401 | — | 0.09 (La) | 0.02 | 1.00 | 0.02 | 0.03 (Ta) | 1345 |
| 402 | — | 0.09 (La) | 0.02 | 1.00 | 0.02 | 0.03 (Sb) | 1320 |
| 403 | 0.15 | 0.02 (La) | 0.02 | 0.96 | 0.02 | 0.03 (Nb) | 1265 |
| 404 | 0.15 | 0.02 (La) | 0.02 | 0.96 | 0.02 | 0.03 (Nb:Ta = 75:25) | 1320 |
| 405 | 0.15 | 0.02 (La) | 0.02 | 0.96 | 0.02 | 0.03 (Nb:Ta = 58:42) | 1320 |
| 406 | 0.15 | 0.02 (La) | 0.02 | 0.96 | 0.02 | 0.03 (Nb:Ta = 50:50) | 1320 |
| 407 | 0.15 | 0.02 (La) | 0.02 | 0.96 | 0.02 | 0.03 (Nb:Ta = 42:58) | 1320 |
| 408 | 0.15 | 0.02 (La) | 0.02 | 0.96 | 0.02 | 0.03 (Nb:Ta = 34:66) | 1320 |
| 409 | 0.15 | 0.02 (La) | 0.02 | 0.96 | 0.02 | 0.03 (Nb:Ta = 25:75) | 1320 |
| 410 | 0.15 | 0.02 (La) | 0.02 | 0.96 | 0.02 | 0.03 (Nb:Sb = 75:25) | 1320 |
| 411 | 0.15 | 0.02 (La) | 0.02 | 0.96 | 0.02 | 0.03 (Nb:Sb = 50:50) | 1320 |
| 412 | 0.15 | 0.02 (La) | 0.02 | 0.96 | 0.02 | 0.03 (Nb:Sb = 25:75) | 1320 |
| 413 | 0.15 | 0.02 (La:Pr = 25:75) | 0.02 | 0.96 | 0.02 | 0.03 (Nb:Ta = 50:50) | 1303 |
| 414 | 0.167 | 0.0223 (La:Pr = 25:75) | 0.02 | 0.96 | 0.02 | 0.03 (Nb:Ta = 50:50) | 1303 |
| 415 | 0.132 | 0.0176 (La:Pr = 25:75) | 0.02 | 0.96 | 0.02 | 0.03 (Nb:Ta = 50:50) | 1303 |
| 416 | 0.115 | 0.0153 (La:Pr = 25:75) | 0.02 | 0.96 | 0.02 | 0.03 (Nb:Ta = 50:50) | 1303 |
| 417 | 0.15 | 0.02 (La:Pr = 25:75) | 0.02 | 0.96 | 0.02 | 0.01 (Nb:Ta = 50:50) | 1303 |
| 418 | 0.15 | 0.02 (La:Pr = 25:75) | 0.02 | 0.96 | 0.02 | 0.05 (Nb:Ta = 50:50) | 1303 |
| 419** | 0.25* | —* | —* | 0.96 | 0.02 | 0.03 (Nb) | 1320 |
| 420** | 0.25* | —* | 0.02 | 0.96 | 0.02 | —* | 1320 |
| 421** | 0.15 | 0.02 (La) | 0.03 | 0.96 | 0.07* | —* | 1320 |
| 422** | 0.15 | 0.02 (La) | 0.03 | 0.96 | —* | 0.07 (Nb)* | 1340 |
| 423** | 0.15 | 0.02 (La) | 0.02 | 0.96 | 0.003* | 0.03 (Nb) | 1320 |
| 424** | 0.15 | 0.02 (La) | 0.02 | 0.96 | 0.02 | 0.003 (Nb)* | 1320 |

*) Outside the scope of the present invention
**) Comparison

TABLE 8

(continued from Table 7)

| Sample No. | Density (g/cm³) | Temperature (ppm/° C.) | Qmax $Q_L$ | Qmax $Q_{S2}$ | q $q_L$ | q $q_{S2}$ | $q_{S2}/q_L$ (%) | Remarks |
|---|---|---|---|---|---|---|---|---|
| 401 | 7.79 | 13.57 | 14.63 | 12.06 | 66.94 | 63.80 | 95.30 | |
| 402 | 7.69 | 16.52 | 13.91 | 10.50 | 66.06 | 60.10 | 90.97 | |
| 403 | 7.43 | −9.61 | 20.87 | 16.57 | 72.37 | 65.85 | 90.99 | |
| 404 | 7.45 | −7.80 | 21.23 | 16.30 | 71.82 | 68.86 | 95.88 | |
| 405 | 7.44 | −1.15 | 21.77 | 13.40 | 73.74 | 69.03 | 93.62 | |
| 406 | 7.47 | −7.75 | 22.09 | 14.12 | 73.52 | 66.67 | 90.68 | |
| 407 | 7.47 | −5.11 | 21.77 | 14.64 | 73.60 | 67.01 | 91.05 | |
| 408 | 7.47 | −2.46 | 21.85 | 15.15 | 73.32 | 69.18 | 94.35 | |
| 409 | 7.50 | −7.37 | 22.14 | 16.00 | 73.23 | 65.90 | 90.00 | |
| 410 | 7.45 | −7.42 | 20.97 | 15.80 | 72.52 | 65.30 | 90.04 | |
| 411 | 7.45 | −6.23 | 19.94 | 14.50 | 72.29 | 66.65 | 92.20 | |
| 412 | 7.46 | −5.62 | 18.66 | 14.50 | 71.41 | 67.48 | 94.50 | |
| 413 | 7.46 | −1.32 | 21.94 | 14.76 | 73.20 | 65.90 | 90.03 | |
| 414 | 7.42 | −2.78 | 23.03 | 15.24 | 73.00 | 65.70 | 90.00 | |
| 415 | 7.51 | 0.49 | 22.33 | 14.76 | 72.80 | 65.60 | 90.11 | |
| 416 | 7.56 | 0.65 | 21.25 | 15.80 | 72.19 | 67.00 | 92.81 | |
| 417 | 7.43 | −2.61 | 24.05 | 18.00 | 75.00 | 67.50 | 90.01 | |
| 418 | 7.49 | −3.00 | 23.54 | 15.77 | 74.66 | 67.65 | 90.61 | |
| 419** | 7.26 | — | 9.58 | 9.91 | 60.29 | 48.86 | 81.04 | |
| 420** | 7.16 | — | 1.00 | 0.06 | 14.00 | 13.50 | 96.43 | |
| 421** | 7.35 | — | — | — | — | — | — | PNP |
| 422** | 7.00 | — | — | — | — | — | — | PNP |
| 423** | 7.40 | — | — | — | — | — | — | EBD |
| 424** | 7.40 | — | — | — | — | — | — | EBD |

PNP: Polarization not possible
EBD: Electric breakdown

The samples of the present invention shown in Table 8 gave results equivalent to those of the samples of the present invention in the other Examples described above. Table 8 also shows that if at least Ta or Sb is used as Me, the decrease in q caused by the downsizing can be reduced as compared with a case using Nb alone.

In contrast, in comparative sample No. 419, since the sinterability is poor, Qmax is small, q is also small, and the ratio of a change in q caused by the downsizing increases.

This is considered to be caused by the addition of no Bi. In comparative sample No. 420, Qmax and q are further smaller. It is assumed that the above is because the sinterability is immensely deteriorated by the addition of no Me so that the density decreases. In comparative samples Nos. 421 and 422, the electric resistance was low, electric current flowed to excess in the polarization treatment, and the sample did not undergo easy polarization, so that the polarization was substantially impossible. Piezoelectric characteristics were therefore not obtained. It is considered that the above is caused since Mn or Me is not added. In comparative samples Nos. 423 and 424, an electric breakdown was caused during the polarization treatment, and the samples were broken. It is considered that the above is caused since the amount of Mn or Me is too small. Since the samples Nos. 419 and 420 had notably low characteristics, they were not measured for coefficients of resonance frequency.

Figure 3:
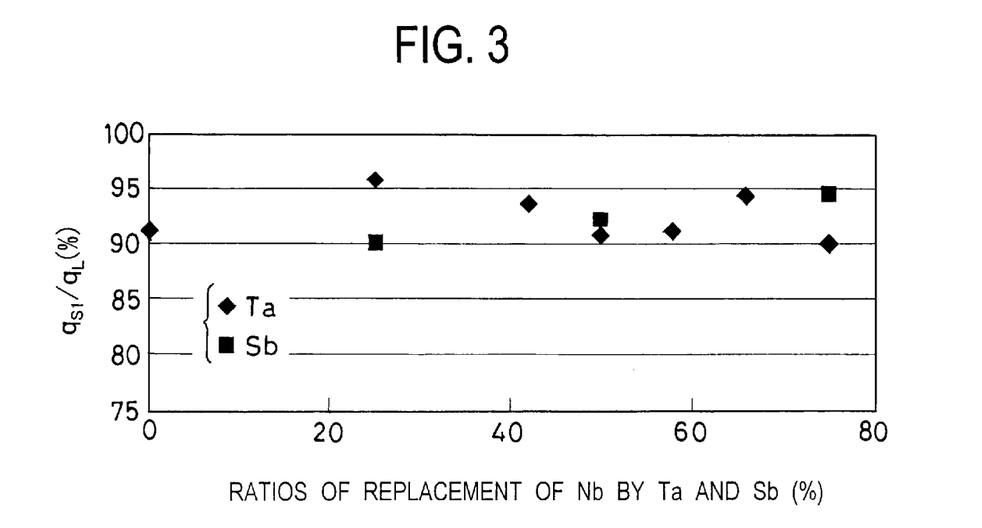
FIG. 3 is a graph showing a relationship between a ratio of replacement of Nb by Ta or Sb and a ratio of q of a small-area element to q of a large-area element (qs1/qL).

For confirming the effect produced by the use of Ta or Sb as Me, Nb in $(Pb_{0.77}Sr_{0.15}La_{0.02}Bi_{0.02})(Ti_{0.95}Mn_{0.02}Nb_{0.03})O_3$ was replaced by Ta or Sb, and a relationship between the replacement ratio and qs1/qL was studied. FIG. 3 shows the result. As already described, the qs1 is q when the electrode-forming surface has plan dimensions of 2.7 mm×0.85 mm (an area of 2.30 mm²). FIG. 3 shows that the qs1/qL greatly changes by replacing part of Nb with Ta or Sb. That is, it is seen that the decrease in q caused by downsizing is reduced.

Effect of the Invention

The piezoelectric ceramic of the present invention achieves a high density, good temperature characteristics and a high Curie temperature. Further, the decrease in Qmax and the decrease in q caused by downsizing can be prevented. Further, an increase in a fundamental wave and the occurrence of a spuriousness in the vicinity of third harmonic can be fully prevented.

What is claimed is:

1. A piezoelectric ceramic having a composition of the general formula, $$(Pb_{a-x-y-z}Sr_xLn_yBi_z)(Ti_{1-b-c}Mn_bMe_c)O_3$$

wherein Ln is at least one element selected from the group consisting of La, Ce and Pr, Me is at least one element selected from the group consisting of Nb, Sb and Ta, and x, y, z, a, b and c represent molar ratios, the composition satisfying $0 \leq x \leq 0.2$,
$0 < y \leq 0.1$,
$0.001 \leq z \leq 0.1$,
$0.93 \leq a \leq 1$,
$0.005 \leq b \leq 0.05$, and
$0.005 \leq c \leq 0.05$.

2. The piezoelectric ceramic as recited in claim 1, which has a Curie temperature of at least 290° C.

3. The piezoelectric ceramic as recited in claim 1 or 2, which permits an electrode-forming surface of 16 mm² or less when utilized as a piezoelectric element.

* * * * *

UNITED STATES PATENT AND TRADEMARK OFFICE
CERTIFICATE OF CORRECTION

PATENT NO. : 6,090,306
DATED : July 18, 2000
INVENTOR(S): Taeko TSUBOKURA et al.

It is certified that an error appears in the above-identified patent and that said Letters Patent is hereby corrected as shown below:

Title page, [75], line 3, delete "Nihonbashi" and insert --Tokyo--.

Signed and Sealed this

Seventeenth Day of April, 2001

NICHOLAS P. GODICI

*Attest:*

*Attesting Officer*     Acting Director of the United States Patent and Trademark Office